United States Patent
Cao et al.

(10) Patent No.: US 10,665,649 B2
(45) Date of Patent: May 26, 2020

(54) ORGANIC LIGHT EMITTING DIODE SCREEN AND MANUFACTURING METHOD THEREOF

(71) Applicant: Wuhan China Star Optoelectronics Semiconductor Display Technology Co., Ltd., Wuhan, Hubei (CN)

(72) Inventors: Haoran Cao, Hubei (CN); Pilgeun Chun, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/234,355

(22) Filed: Dec. 27, 2018

(65) Prior Publication Data

US 2019/0326371 A1    Oct. 24, 2019

Related U.S. Application Data

(63) Continuation of application No. PCT/CN2018/089412, filed on May 31, 2018.

(30) Foreign Application Priority Data

Apr. 24, 2018   (CN) .......................... 2018 1 0372504

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 51/5221* (2013.01);
(Continued)

(58) Field of Classification Search
CPC ............. H01L 51/5253; H01L 51/0097; H01L 51/528; H01L 27/3246; H01L 27/3258
See application file for complete search history.

(56) References Cited

U.S. PATENT DOCUMENTS

2004/0224486 A1* 11/2004 Ichijo ................ H01L 29/66757
                                                                438/482
2005/0035353 A1*  2/2005 Adachi ................... H01L 27/12
                                                                 257/72
(Continued)

FOREIGN PATENT DOCUMENTS

CN          107025848 A      8/2017

*Primary Examiner* — Dale E Page
*Assistant Examiner* — Quovaunda Jefferson
(74) *Attorney, Agent, or Firm* — Leong C. Lei

(57) ABSTRACT

Provided are an OLED screen and a manufacturing method thereof. The OLED screen has a display area and a peripheral area located on a left side and a right side of the display area. The OLED screen comprises: a back plate, a polyimide layer, an array layer, an OLED layer, a thin film encapsulation layer, a polarizer and a cover plate stacked in order; a mirror layer is disposed between the thin film encapsulation layer and the polarizer, and at least a portion of the mirror layer in the peripheral area is not covered with the polarizer; a portion of the cover plate in the peripheral area is not covered with ink. When the organic light emitting diode screen is lit, the light emitted by the organic light emitting diode layer can be transmitted out of the peripheral area to achieve a frameless display effect.

10 Claims, 3 Drawing Sheets

(52) U.S. Cl.
CPC ...... *H01L 51/5253* (2013.01); *H01L 51/5271* (2013.01); *H01L 51/5293* (2013.01); *H01L 51/56* (2013.01); *H01L 2227/323* (2013.01)

(56) References Cited

U.S. PATENT DOCUMENTS

2005/0041002 A1* 2/2005 Takahara ............ G09G 3/3241
        345/76
2016/0056415 A1* 2/2016 Yoo .................... H01L 51/5284
        349/43

* cited by examiner

ORGANIC LIGHT EMITTING DIODE SCREEN AND MANUFACTURING METHOD THEREOF

CROSS-REFERENCE TO RELATED APPLICATION

This application is a continuing application of PCT Patent Application No. PCT/CN2018/089412 entitled "Organic light emitting diode screen and manufacturing method thereof", filed on May 31, 2018, which claims priority to Chinese Patent Application No. 201810372504.4, filed on Apr. 24, 2018, both of which are hereby incorporated in its entireties by reference.

FIELD OF THE INVENTION

The present invention relates to a screen display field, and more particularly to an organic light emitting diode screen and a manufacturing method thereof.

BACKGROUND OF THE INVENTION

At present, the ultra-narrow frame is pursued for the mobile phone market. Even being frameless may become the mainstream. Major mobile phone manufacturing companies and screen research, development and manufacturing companies are actively developing in research and development of related technologies. The organic light emitting diode screen can realize the effect of bending to the curved screen at the left frame and the right frame, thereby shortening the width of the left frame and the right frame because of the flexible and bendable properties. However, the 3D glass has a low yield rate and a high cost. Once the mobile phone is dropped, the screen is easily broken, and the left frame and the right frame still possess a width of approximately 1 mm. The frameless effect cannot be achieved.

SUMMARY OF THE INVENTION

An objective of the present invention is to provide an organic light emitting diode screen and a manufacturing method thereof, which can achieve a frameless display effect.

For solving the aforesaid technical issues, the present invention provides an organic light emitting diode screen, having a display area and a peripheral area located on a left side and a right side of the display area, wherein the organic light emitting diode screen comprises:

a back plate, a polyimide layer, an array layer, an organic light emitting diode layer, a thin film encapsulation layer, a polarizer and a cover plate stacked in order;

wherein a mirror layer is disposed between the thin film encapsulation layer and the polarizer, and at least a portion of the mirror layer in the peripheral area is not covered with the polarizer;

a portion of the cover plate in the peripheral area is not covered with ink.

The organic light emitting diode layer comprises a plurality of luminous sub pixels separated by a pixel definition layer, and a cathode is disposed on the pixel definition layer and the luminous sub pixels, and a thickness of the cathode on the pixel definition layer in the peripheral area is greater than a thickness of the cathode on the luminous sub pixels.

A thickness of the pixel definition layer in the peripheral area is less than a thickness of the pixel definition layer between two adjacent luminous sub pixels.

The array layer comprises a buffer layer, a thin film transistor disposed on the buffer layer, and a planarization layer disposed on the thin film transistor, and the cathode, the pixel definition layer and the planarization layer in the peripheral area are bent toward the thin film transistor and form a first bending angle with an initial position thereof; or bent away from the thin film transistor and forms a second bending angle with the initial position thereof.

Both the first bending angle and the second bending angle are in a range of 0 degrees to 60 degrees.

At least a portion of the mirror layer is located in the display area.

At least a portion of the polarizer is located in the peripheral area.

The mirror layer is a single layer or a multi-layer metal silver layer.

The present invention further provides a manufacturing method of an organic light emitting diode screen, comprising:

stacking a back plate, a polyimide layer, an array layer and an organic light emitting diode layer in order, in a display area and in an peripheral area defined on a left side and a right side of the display area;

forming a cathode on luminous sub pixels on the organic light emitting diode layer and on a pixel definition layer for separating the luminous sub pixels, wherein a thickness of the cathode on the pixel definition layer in the peripheral area is greater than a thickness of the cathode on the luminous sub pixels;

forming a thin film encapsulation layer for packaging the back plate, the polyimide layer, the array layer and the organic light emitting diode layer;

disposing a polarizer on the thin film encapsulation layer, and disposing a mirror layer between the thin film encapsulation layer and the polarizer, wherein at least a portion of the mirror layer in the peripheral area is not covered with the polarizer; and disposing a cover plate on the polarizer, wherein a portion of the cover plate in the peripheral area is not covered with ink.

Forming the array layer comprises: forming a buffer layer, and forming a thin film transistor on the buffer layer, and forming a planarization layer on the thin film transistor;

bending the cathode, the pixel definition layer and the planarization layer in the peripheral area toward the thin film transistor, and forming a first bending angle with an initial position thereof; or bending the cathode, the pixel definition layer and the planarization layer in the peripheral area away from the thin film transistor and forming a second bending angle with the initial position thereof.

The benefits of the embodiment of the present invention are: a mirror layer is disposed in the peripheral area on the left side and the right side of the display area, at least a portion of the mirror layer is not covered by the polarizer thereon, and the cover plate on the polarizer is also not covered with ink. When the organic light emitting diode screen is lit, the light emitted by the organic light emitting diode layer can be transmitted out of the peripheral area to achieve a frameless display effect; when the organic light emitting diode layer does not emit light, the mirror layer can reflect the external light to achieve the display effect of the mirror-type organic light emitting diode screen, and can prevent the traces in the peripheral area from being observed from the outside;

the cathode on the pixel definition layer in the peripheral area is thickened, such that a thickness of the cathode on the pixel definition layer is greater than a thickness of the cathode on the luminous sub pixels for further enhancing the mirror effect;

the cathode, the pixel definition layer and the planarization layer in the peripheral area are bent for facilitating the light emitted by the luminous sub pixels near the peripheral area to be reflected at an appropriate angle to form a better frameless display effect.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
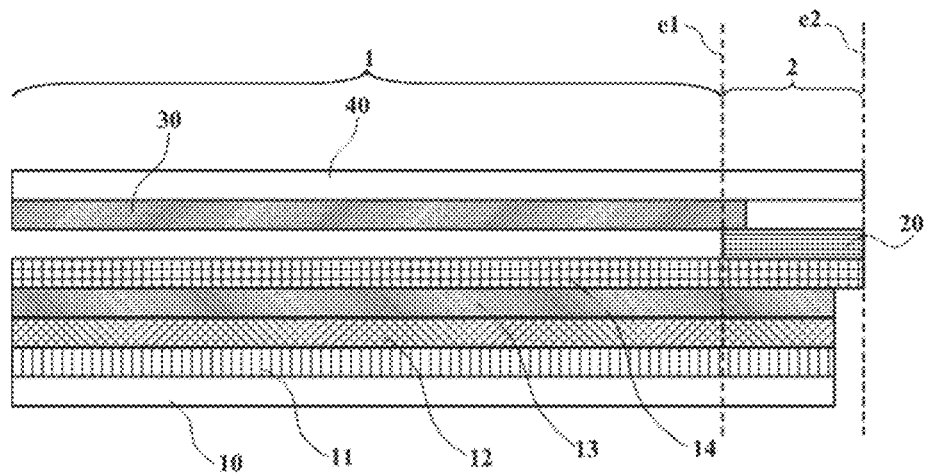
FIG. 1 is a schematic side view structural diagram of an organic light emitting diode screen according to the first embodiment of the present invention.

Please refer to FIG. 1. The first embodiment of the present invention provides an organic light emitting diode screen, having a display area 1 and a peripheral area 2 located on a left side and a right side of the display area 1, wherein the organic light emitting diode screen comprises:

a back plate 10, a polyimide layer 11, an array layer 12, an organic light emitting diode layer 13, a thin film encapsulation layer 14, a polarizer 30 and a cover plate 40 stacked in order;

wherein a mirror layer 20 is disposed between the thin film encapsulation layer 14 and the polarizer 30, and at least a portion of the mirror layer 20 in the peripheral area 2 is not covered with the polarizer 30;

a portion 400 of the cover plate 40 in the peripheral area 2 is not covered with ink.

In the organic light emitting diode screen of this embodiment, at least a portion of the mirror layer 20 in the peripheral area 2 is not covered with the polarizer 30, and meanwhile, the cover plate 40 on the polarizer 30 is not covered with ink. When the organic light emitting diode screen is lit, the light emitted by the organic light emitting diode layer 13 can be transmitted out of the peripheral area 2 to achieve a frameless display effect; when the organic light emitting diode layer 13 does not emit light, the mirror layer 20 can reflect the external light to achieve the display effect of the mirror-type organic light emitting diode screen, and can prevent the traces in the peripheral area 2 from being observed from the outside.

Specifically, OLED screen of this embodiment is a stacked structure having a thickness. The display area 1 and the peripheral area 2, which are defined, are also stacked structures with a thickness. As an illustration, FIG. 1 shows a display area 1 and a peripheral area 2 on the right side of an organic light emitting diode screen according to the present embodiment. The first edge line e1 indicates a right edge of the display area 1. The second edge line e2 indicates an edge of the peripheral area 2 on the right side of the display area 1. The peripheral area 2 is an area between the first edge line e1 and the second edge line e2. It can be understood that, on the left side of the display area 1, there is also a left-side peripheral area that has the same structure and is disposed symmetrically with the right-side peripheral area 2.

In this embodiment, the organic light emitting diode screen adopts a polyimide layer 11 instead of the glass in the liquid crystal panel as a substrate of the display screen, and an array process is performed thereon, and a back plate (BP) 10 is adhered under the polyimide layer 12. A material of the back plate 10 is a PET (polyethylene terephthalate), which can improve the rigidity of the organic light emitting diode display to prevent the display screen from being too soft, and to make the display screen have a certain degree of flexibility at the same time. In the production, the array layer 12 is prepared on the polyimide layer 11, which the back plate 10 is attached. The array layer 12 serves as a thin film transistor array substrate for controlling light emission of the upper organic light emitting diode layer. According to design requirements, the organic light emitting diode layer 13 and the thin film encapsulation (TFE) layer 14 are further formed in a predetermined area. The organic light emitting diode layer 13 functions as an organic light emitting layer to realize light emission of the pixel. The role of the thin film encapsulation layer 14 is to encapsulate the light emitting layer to prevent moisture from damaging the material and element of the light emitting layer.

Figure 2:
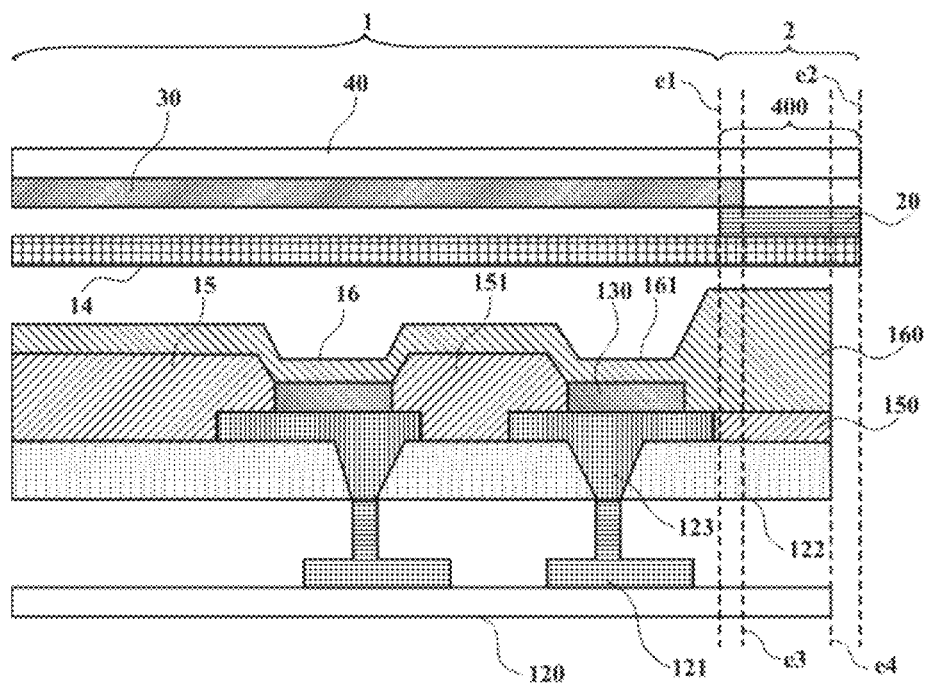
FIG. 2 is a schematic side view specific structural diagram of an organic light emitting diode screen according to the first embodiment of the present invention.

Please refer to FIG. 2 is a schematic side view specific structural diagram of the array layer 12 and the structure thereon in the organic light emitting diode screen shown in FIG. 1, The array layer 12 comprises a buffer layer 120, a thin film transistor (TFT) 121 disposed on the buffer layer 120, a planarization layer 122 disposed on the thin film transistor 121 and an anode 123 disposed on the planarization layer 122 and connected to the thin film transistor 121 through a contact hole. The organic light emitting diode layer 13 comprises a plurality of luminous sub pixels 130, and the luminous sub pixels 130 are separated by a pixel definition layer (PDL) 15 provided on the anode 123 and the planarization layer 122 to prevent color mixing. A cathode 16 is disposed on the pixel definition layer 15 and the luminous sub pixels 130. A main component of the cathode 16 is a metal such as magnesium (Mg) or silver (Ag). In case that the cathode 160 on the pixel definition layer 15 in the peripheral area 2 is thickened, when the luminous sub pixels 130 do not emit light, the peripheral area 2 may exhibit a mirror-like effect, and when the luminous sub pixels 130 emit light, the peripheral area can normally display again, thereby achieving a frameless display effect. Therefore, in this embodiment, in addition to providing the mirror layer 20 between the thin film encapsulation layer 14 and the polarizer 30, for further enhancing the mirror effect of the peripheral area 2, the cathode 160 on the pixel definition layer 150 in the peripheral area 2 is also thickened, such that a thickness of the cathode 160 on the pixel definition layer 150 is greater than a thickness of the cathode 161 on the luminous sub pixels 130. Furthermore, the thickness of the pixel definition layer 150 in the peripheral area 2 is reduced to be less than the thickness of the pixel definition layer 151 between the adjacent two luminous sub pixels 130. Thus, the light emitted by the luminous sub pixels 130 located at the edge of the display area 1 will not be blocked by the pixel definition layer 150 and will be reflected by the cathode 160 to achieve a frameless display effect.

The mirror layer 20 is a single layer or a multi-layer metal silver layer (Ag), which can be formed by deposition or evaporation. For ensuring the optical effect, the mirror layer 20 can properly cover the display area 1. Namely, the mirror layer 20 can be partially located in the display area 1. Similarly, at least a portion of the polarizer 30 is located in the peripheral area 2, and the edge line thereof is as shown by a third edge line e3 in FIG. 2. An edge line of the cathode 16 is shown as a fourth edge line e4 in FIG. 2, and the third edge line e3 and the fourth edge line e4 are located between the first edge line e1 and the second edge line e2.

Figure 3:
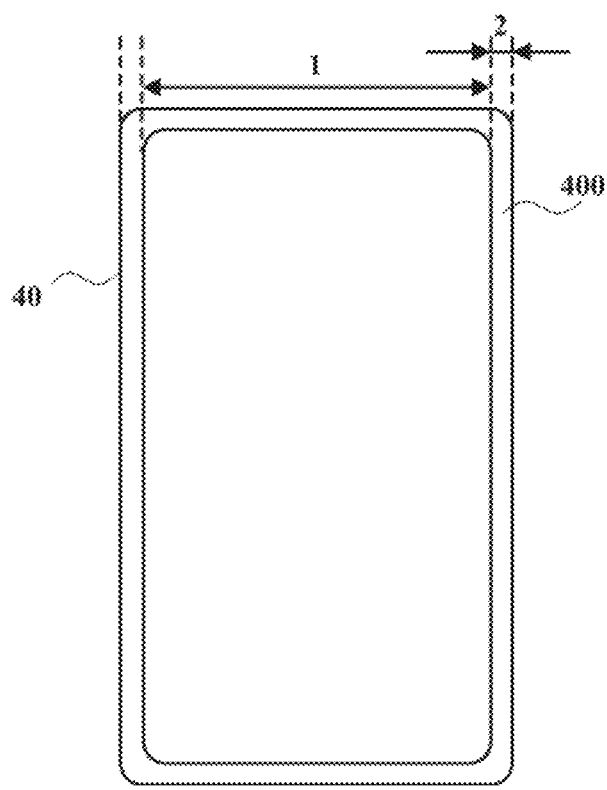
FIG. 3 is a schematic front view structural diagram of an organic light emitting diode screen according to the first embodiment of the present invention.

Understandably, in a typical organic light emitting diode screen, the peripheral area of the left end and the right end of the cover plate will be printed with ink; as shown in FIG. 3, the organic light emitting diode screen of the present embodiment eliminates the ink printing of the left and right peripheral areas 2 of the cover plate 40. Namely, the portion 400 of the cover plate 40 in the peripheral area 2 is not covered with ink, so that the peripheral area 2 as displaying is shortened to achieve a frameless display effect.

Figure 4:
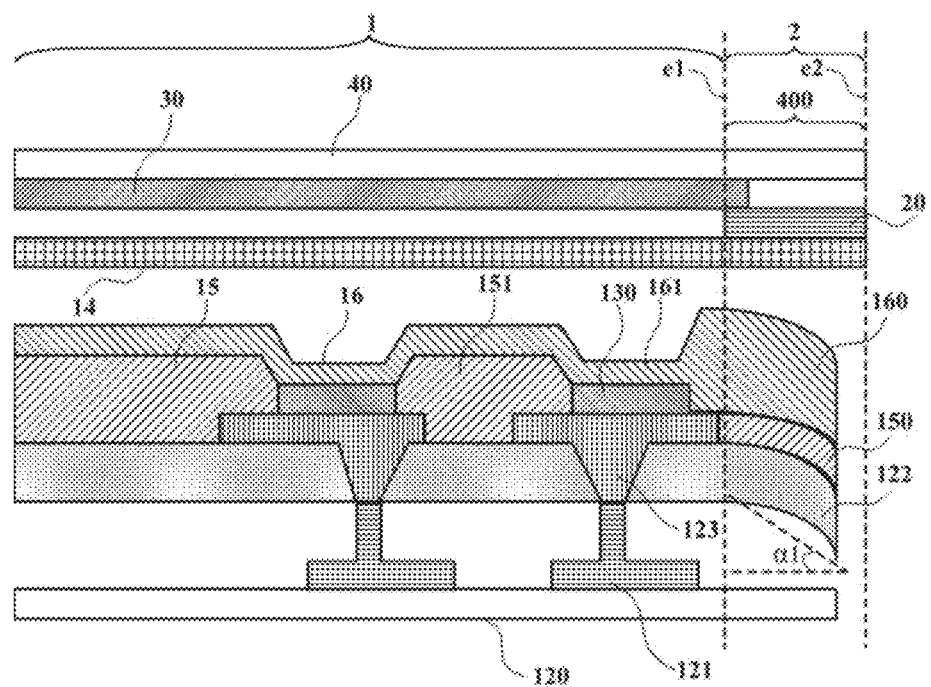
FIG. 4 is another schematic side view specific structural diagram of an organic light emitting diode screen according to the first embodiment of the present invention.
Figure 5:
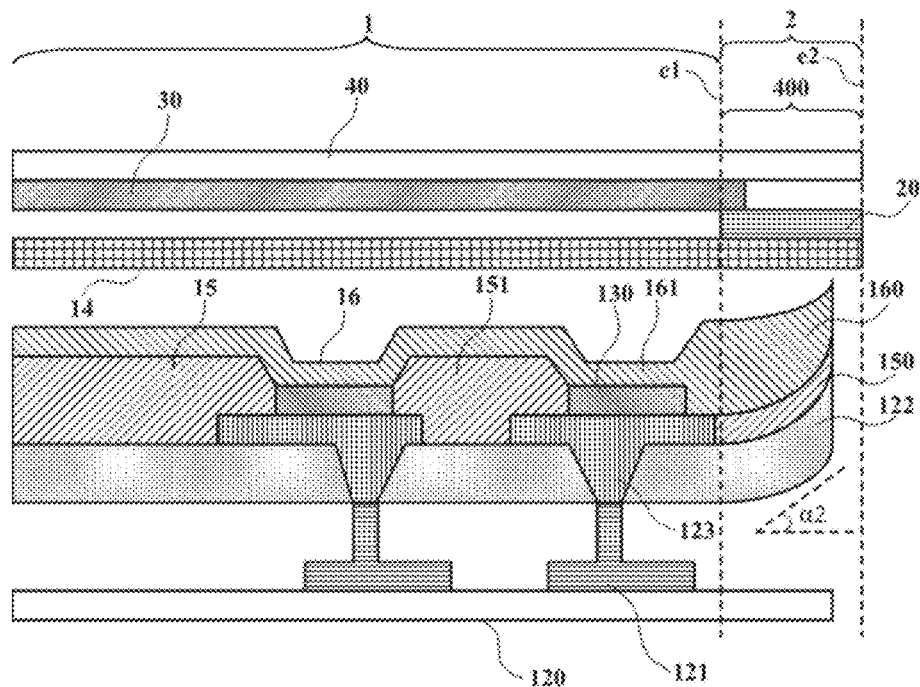
FIG. 5 is one another schematic side view specific structural diagram of an organic light emitting diode screen according to the first embodiment of the present invention.

In order to facilitate the light emitted by the luminous sub pixels 130 near the peripheral area 2 to be reflected at an appropriate angle to form a better frameless display effect, the present embodiment further bends the cathode 160, the pixel definition layer 150 and the planarization layer 122 in the peripheral area 2. Specifically, referring to FIG. 4 and FIG. 5 respectively, the cathode 160, the pixel definition layer 150 and the planarization layer 122 in the peripheral area 2 are bent toward the thin film transistor 121 and form a first bending angle α1 with an initial position thereof in FIG. 4; the cathode 160, the pixel definition layer 150 and the planarization layer 122 in the peripheral area 2 are bent away from the thin film transistor 121 and forms a second bending angle α2 with the initial position thereof in FIG. 5. The first bending angle α1 and the second bending angle α2 are both in a range of 0 degrees to 60 degrees, and the specific value is determined by the display effect, which can be verified through experiments.

Figure 6:
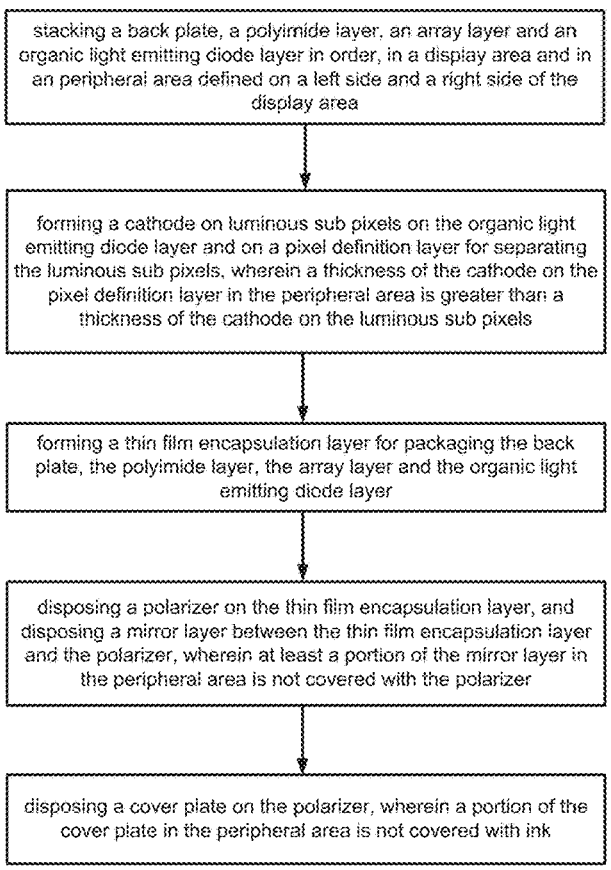
FIG. 6 is a flowchart of a manufacturing method of an organic light emitting diode screen according to the second embodiment of the present invention.

Please refer to FIG. 6. Corresponding to the organic light emitting diode screen according to the first embodiment of the present invention, the second embodiment of the present invention provides a manufacturing method of an organic light emitting diode screen, comprising steps of:

stacking a back plate, a polyimide layer, an array layer and an organic light emitting diode layer in order, in a display area and in an peripheral area defined on a left side and a right side of the display area;

forming a cathode on luminous sub pixels on the organic light emitting diode layer and on a pixel definition layer for separating the luminous sub pixels, wherein a thickness of the cathode on the pixel definition layer in the peripheral area is greater than a thickness of the cathode on the luminous sub pixels;

forming a thin film encapsulation layer for packaging the back plate, the polyimide layer, the array layer and the organic light emitting diode layer;

disposing a polarizer on the thin film encapsulation layer, and disposing a mirror layer between the thin film encapsulation layer and the polarizer, wherein at least a portion of the mirror layer in the peripheral area is not covered with the polarizer; and disposing a cover plate on the polarizer, wherein a portion of the cover plate in the peripheral area is not covered with ink.

Forming the array layer comprises: forming a buffer layer, and forming a thin film transistor on the buffer layer, and forming a planarization layer on the thin film transistor;

bending the cathode, the pixel definition layer and the planarization layer in the peripheral area toward the thin film transistor, and forming a first bending angle with an initial position thereof; or bending the cathode, the pixel definition layer and the planarization layer in the peripheral area away from the thin film transistor and forming a second bending angle with the initial position thereof.

With FIG. 1 to FIG. 5, in the production of the organic light emitting diode screen, the array layer 12 is prepared on the polyimide layer 11, which the back plate 10 is attached. The array layer 12 serves as a thin film transistor array substrate for controlling light emission of the upper organic light emitting diode layer 13. The array layer 12 comprises a buffer layer 120, a thin film transistor (TFT) 121 disposed on the buffer layer 120, a planarization layer 122 disposed on the thin film transistor 121 and an anode 123 disposed on the planarization layer 122 and connected to the thin film transistor 121 through a contact hole. The organic light emitting diode layer 13 comprises a plurality of luminous sub pixels 130, and the luminous sub pixels 130 are separated by a pixel definition layer 15 provided on the anode 123 and the planarization layer 122 to prevent color mixing. A cathode 16 is disposed on the pixel definition layer 15 and the luminous sub pixels 130. A main component of the cathode 16 is a metal such as magnesium (Mg) or silver (Ag). In case that the cathode 160 on the pixel definition layer 15 in the peripheral area 2 is thickened, when the luminous sub pixels 130 do not emit light, the peripheral area 2 may exhibit a mirror-like effect, and when the luminous sub pixels 130 emit light, the peripheral area can normally display again, thereby achieving a frameless display effect. Therefore, in this embodiment, in addition to providing the mirror layer 20 between the thin film encapsulation layer 14 and the polarizer 30, for further enhancing the mirror effect of the peripheral area 2, the cathode 160 on the pixel definition layer 150 in the peripheral area 2 is also thickened, such that a thickness of the cathode 160 on the pixel definition layer 150 is greater than a thickness of the cathode 161 on the luminous sub pixels 130. Furthermore, the thickness of the pixel definition layer 150 in the peripheral area 2 is reduced to be less than the thickness of the pixel definition layer 151 between the adjacent two luminous sub pixels 130. Thus, the light emitted by the luminous sub pixels 130 located at the edge of the display area 1 will not be blocked by the pixel definition layer 150 and will be reflected by the cathode 160 to achieve a frameless display effect.

Specifically, the mirror layer 20 is a single layer or a multi-layer metal silver layer, which can be formed by deposition or evaporation.

In order to facilitate the light emitted by the luminous sub pixels 130 near the peripheral area 2 to be reflected at an appropriate angle to form a better frameless display effect, the present embodiment further bends the cathode 160, the pixel definition layer 150 and the planarization layer 122 in the peripheral area 2. Specifically, referring to FIG. 4 and FIG. 5 respectively, the cathode 160, the pixel definition layer 150 and the planarization layer 122 in the peripheral area 2 are bent toward the thin film transistor 121 and form a first bending angle α1 with an initial position thereof in FIG. 4; the cathode 160, the pixel definition layer 150 and the planarization layer 122 in the peripheral area 2 are bent away from the thin film transistor 121 and forms a second bending angle α2 with the initial position thereof in FIG. 5. The first bending angle α1 and the second bending angle α2 are both in a range of 0 degrees to 60 degrees, and the specific value is determined by the display effect, which can be verified through experiments.

With the aforesaid description, the benefits of the embodiment of the present invention are: a mirror layer is disposed in the peripheral area on the left side and the right side of the display area, at least a portion of the mirror layer is not covered by the polarizer thereon, and the cover plate on the polarizer is also not covered with ink. When the organic light emitting diode screen is lit, the light emitted by the organic light emitting diode layer can be transmitted out of the peripheral area to achieve a frameless display effect; when the organic light emitting diode layer does not emit light, the mirror layer can reflect the external light to achieve the display effect of the mirror-type organic light emitting diode screen, and can prevent the traces in the peripheral area from being observed from the outside;

the cathode on the pixel definition layer in the peripheral area is thickened, such that a thickness of the cathode on the pixel definition layer is greater than a thickness of the cathode on the luminous sub pixels for further enhancing the mirror effect;

the cathode, the pixel definition layer and the planarization layer in the peripheral area are bent for facilitating the light emitted by the luminous sub pixels near the peripheral area to be reflected at an appropriate angle to form a better frameless display effect.

Above are embodiments of the present invention, which does not limit the scope of the present invention. Any equivalent amendments within the spirit and principles of the embodiment described above should be covered by the protected scope of the invention.

What is claimed is:

1. An organic light emitting diode screen, having a display area (1) and a peripheral area (2) located on a left side and a right side of the display area (1), wherein the organic light emitting diode screen comprises:
    a back plate (10), a polyimide layer (11), an array layer (12), an organic light emitting diode layer (13), a thin film encapsulation layer (14), a polarizer (30) and a cover plate (40) stacked in order;
    wherein a mirror layer (20) is disposed between the thin film encapsulation layer (14) and the polarizer (30), and at least a portion of the mirror layer (20) in the peripheral area (2) is not covered with the polarizer (30).

2. The organic light emitting diode screen according to claim 1, wherein the organic light emitting diode layer (13) comprises a plurality of luminous sub pixels (130) separated by a pixel definition layer (15), and a cathode (16) is disposed on the pixel definition layer (15) and the luminous sub pixels (130), and a thickness of the cathode (160) on the pixel definition layer (150) in the peripheral area (2) is greater than a thickness of the cathode (161) on the luminous sub pixels (130).

3. The organic light emitting diode screen according to claim 2, wherein a thickness of the pixel definition layer (150) in the peripheral area (2) is less than a thickness of the pixel definition layer (151) between two adjacent luminous sub pixels (130).

4. The organic light emitting diode screen according to claim 2, wherein the array layer (12) comprises a buffer layer (120), a thin film transistor (121) disposed on the buffer layer (120), and a planarization layer (122) disposed on the thin film transistor (121), and the cathode (160), the pixel definition layer (150) and the planarization layer (122) in the peripheral area (2) are bent toward the thin film transistor (121) and form a first bending angle with an initial position thereof; or bent away from the thin film transistor (121) and forms a second bending angle with the initial position thereof.

5. The organic light emitting diode screen according to claim 4, wherein both the first bending angle and the second bending angle are in a range of 0 degrees to 60 degrees.

6. The organic light emitting diode screen according to claim 1, wherein at least a portion of the mirror layer (20) is located in the display area (1).

7. The organic light emitting diode screen according to claim 1, wherein at least a portion of the polarizer (30) is located in the peripheral area (2).

8. The organic light emitting diode screen according to claim 1, wherein the mirror layer (20) is a single layer or a multi-layer metal silver layer.

9. A manufacturing method of an organic light emitting diode screen, comprising:
    stacking a back plate, a polyimide layer, an array layer and an organic light emitting diode layer in order, in a display area and in an peripheral area defined on a left side and a right side of the display area;
    forming a cathode on luminous sub pixels on the organic light emitting diode layer and on a pixel definition layer for separating the luminous sub pixels, wherein a thickness of the cathode on the pixel definition layer in the peripheral area is greater than a thickness of the cathode on the luminous sub pixels;
    forming a thin film encapsulation layer for packaging the back plate, the polyimide layer, the array layer and the organic light emitting diode layer;
    disposing a polarizer on the thin film encapsulation layer, and disposing a mirror layer between the thin film encapsulation layer and the polarizer, wherein at least a portion of the mirror layer in the peripheral area is not covered with the polarizer; and
    disposing a cover plate on the polarizer.

10. The manufacturing method of the organic light emitting diode screen according to claim 9, wherein forming the array layer comprises: forming a buffer layer, and forming a thin film transistor on the buffer layer, and forming a planarization layer on the thin film transistor;
    bending the cathode, the pixel definition layer and the planarization layer in the peripheral area toward the thin film transistor, and forming a first bending angle with an initial position thereof; or bending the cathode, the pixel definition layer and the planarization layer in the peripheral area away from the thin film transistor and forming a second bending angle with the initial position thereof.

* * * * *